(12) United States Patent
Talbot et al.

(10) Patent No.: US 7,135,884 B1
(45) Date of Patent: Nov. 14, 2006

(54) VOLTAGE MODE TRANSCEIVER HAVING PROGRAMMABLE VOLTAGE SWING AND EXTERNAL REFERENCE-BASED CALIBRATION

(75) Inventors: Gerald Robert Talbot, Concord, MA (US); Matthew Scheffer, Shrewsbury, MA (US); Austen John Hypher, Newton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 130 days.

(21) Appl. No.: 11/033,757

(22) Filed: Jan. 13, 2005

(51) Int. Cl.
*H03K 17/16* (2006.01)
(52) U.S. Cl. .............................. 326/30; 326/86; 326/87
(58) Field of Classification Search ............ 326/30–34, 326/86, 87; 327/108–112
See application file for complete search history.

(56) References Cited

U.S. PATENT DOCUMENTS

| | | | | |
|---|---|---|---|---|
| 6,734,702 B1 * | 5/2004 | Ikeoku et al. | ............ | 326/30 |
| 2004/0217774 A1 * | 11/2004 | Choe | ............ | 326/30 |

OTHER PUBLICATIONS

"AMD-3181™ HyperTransport™ PCI-X® Tunnel Data Sheet", 24637 Rev. 3.02, Aug. 10, 2004, pp. 1–87.

* cited by examiner

*Primary Examiner*—Anh Q. Tran
(74) *Attorney, Agent, or Firm*—Manelli Denison & Selter PLLC; Leon R. Turkevich (57) ABSTRACT

An integrated device includes a voltage mode transmit driver for matching an output impedance to an output transmission line based on a binary code, an input termination module configured for matching an input impedance to an input transmission line based on an input impedance calibration value using thermometer-based decoding. The voltage mode transmit driver includes, for each differential output signal, a resistor network circuit having pull-up circuits and pull-down circuits for changing the voltage on the differential output signal, and having binary weighted resistance values relative to each other. The input termination module includes pull-up circuits and pull-down circuits having inverse hyperbolic resistance values relative to each other, and using thermometer-based decoding to ensure a linear change in input impedance during transitions in the input impedance calibration value. A calibration circuit generates the binary code and the input impedance calibration value based on replicas of the pull-up and pull-down circuits.

21 Claims, 7 Drawing Sheets

VOLTAGE MODE TRANSCEIVER HAVING PROGRAMMABLE VOLTAGE SWING AND EXTERNAL REFERENCE-BASED CALIBRATION

BACKGROUND OF THE INVENTION

1. Field of the Invention

The present invention relates to driver circuits in digital systems for adjusting input impedance and output impedance of respective receivers and transmitters relative to a prescribed impedance of a transmission line.

2. Background Art

Newer processor architecture designs require transfer of data between large integrated circuits at higher speeds. These higher speeds require that the integrated circuits have input/output impedances that precisely match the prescribed impedance of the PC board traces interconnecting the integrated circuits. In particular, impedance matching is needed to minimize signal reflections caused by a change in impedance at the interface between a signal trace on the PC board and an integrated circuit chip. For example, HyperTransport™ technology specifies a data rate of 1.6 Gbps between each wire pair based on a double data rate using an 800 MHz clock. Hence, precise impedance matching is needed between the signal traces (typically 50 Ohms) and the terminating devices to ensure data integrity in the high-speed digital systems, as well as reliability, faster speeds, and minimal power consumption.

One known technique to provide a matching impedance is to implement a driver circuit on the integrated circuit chip. The driver circuit is configured for providing a controlled, predetermined output impedance that reduces the effects of reflections on the transmission line. Two types of driver circuits can be implemented, namely a voltage mode driver circuit, and a current mode driver circuit. The voltage mode driver circuit typically have a relatively low output impedance, whereas current mode driver circuits have a relatively high output impedance.

Current mode driver circuits tend to be preferred because they do not require accurate accurate voltage mode references; however, a current mode driver circuit must draw from the supply a greater amount of current to implement a given logic voltage swing in comparison to a voltage mode driver circuit. Hence, power consumption is substantially higher in a current mode driver circuit than a voltage mode driver circuit.

Hence, a voltage mode driver circuit provides the advantage of reduced power consumption and a lower output impedance that tends to be closer to the 50 ohm impedance of the transmission line. The voltage mode driver circuit requires a high-precision voltage source that swings between two voltage values ("rails") that represent the respective logic values. Hence, one disadvantage is that the voltage mode driver circuit requires accurate voltage references. The voltage mode driver circuit also is coupled in series with a precision resistor (i.e., a resistor having a tolerance of about 1 percent) having a resistance that matches the transmission line impedance.

However, a problem in implementing a voltage mode driver circuit is that substantial variations in process or manufacturing techniques, voltage supply, and operating temperatures may cause substantial variations in the silicon structure which that implements the digital driver circuitry that includes the voltage mode driver. Consequently, a voltage mode driver circuit on an integrated circuit, when interconnected among different components on a PC board, may encounter in the impedance variations by as much as 50 percent.

Hence, process variations during fabrication and temperature variations can change input/output impedances by a sufficient degree that static impedance matching techniques are insufficient.

SUMMARY OF THE INVENTION

There is a need for dynamic impedance matching to be implemented within integrated circuits in order to enable propagation of high speed digital signals between integrated chips.

There also is a need for an arrangement in a high speed digital circuit that enables a voltage mode driver in the high speed digital circuit to dynamically calibrate to a constant output impedance and provide a programmable differential voltage swing, eliminating the necessity of a precise voltage source.

There also is a need for an arrangement in a high speed digital circuit that enables an input termination module to dynamically calibrate to a constant input impedance for reception of input signals with minimal distortions or reflections on the transmission line supplying the input signals, and with minimal capacitance.

There also is a need for an arrangement in a high speed digital circuit that provides dynamically-adjustable resistor networks in order to match input impedances of receiver circuitry and output impedances of driver circuitry to connected transmission lines.

These and other needs are attainted by the present invention, where an integrated circuit includes a voltage mode transmit driver, and a calibration circuit. The voltage mode transmit driver includes first and second resistor network circuits configured for outputting respective first and second differential signals via respective first and second signal nodes onto first and second differential signal transmission lines having a transmission line impedance. The first and second resistor network circuits each include pull-up circuits configured for selectively changing an impedance on the corresponding signal node of the corresponding resistor network circuit based on respective pull-up gate signals. The pull-up circuits having respective binary weighted resistance values relative to each other. The first and second resistor network circuits also each include pull-down circuits configured for selectively changing an impedance on the corresponding signal node of the corresponding resistor network circuit based on respective pull-down gate signals. The pull-down circuits have the respective binary weighted resistance values relative to each other.

The voltage mode transmit driver also includes a driver controller configured for controlling each of the pull-up gate signals and the pull-down gate signals based on a data input signal, and a clock signal, and a binary code representing an output impedance correction factor, the driver controller configured for causing the first and second resistor network circuits to match an output impedance of the first and second nodes to the transmission line impedance based on the binary code.

The integrated circuit further includes a calibration circuit having a replica of the pull-up circuits and a replica of the pull-down circuits. The calibration circuit is configured for determining the binary code, at prescribed intervals for calibration of the binary weighted resistance values, based on comparing a first voltage to a second voltage across a range of the binary code. The first and second voltages are generated by respective first and second potential dividers formed between first and second external precision resistors and the replicas of the pull-up circuits and the pull-down circuits, respectively. The first and second external precision resistors each have a precision resistance representing an ideal transmission line impedance.

The integrated circuit also may include an input termination module comprising a third resistor network circuit configured for receiving third and fourth differential signals, via respective third and fourth signal nodes, from respective third and fourth differential signal transmission lines having a second transmission line impedance. In this case, the third resistor network includes second pull-up circuits each having a first terminal end coupled to the third signal node and a second terminal end coupled to a common node capacitively coupled to ground. The second pull-up circuits are configured for selectively changing an impedance on the third signal node based on respective gate signals.

The optional input termination module also includes second pull-down circuits, each having a third terminal end coupled to the fourth signal node, a fourth terminal end coupled to a common node, and sharing the gate signal with a corresponding one of the second pull-up circuits. The second pull-down circuits are configured for selectively changing an impedance on the fourth signal node based on the respective gate signals, the second pull-down circuits having the inverse hyperbolically weighted resistance values relative to each other. In addition, the calibration circuit further includes a replica of the third resistor network circuit, and is configured for generating an input impedance calibration value based on comparing the replica of the third resistor network circuit to the first and second external precision resistors, the input impedance calibration value corresponding to the gate signals in a prescribed sequence.

Use of the calibrated resistor network circuits enables the voltage mode transmit driver to create a constant output impedance driver that precisely matches the transmission line impedance, enabling the peak to peak differential voltage swing between the first and second differential signals to be programmed between a supply voltage (e.g., VDD) and a base voltage (e.g., ground).

In addition, the use of pull-up circuits and pull-down circuits sharing gate signals enables the input termination module to achieve a substantially low input capacitance. Moreover, the addition of an on-chip common-mode capacitive coupling to ground provides high frequency common mode termination without consumption of additional DC power.

Use of replicas in the calibration circuit enables the calibration circuit to periodically correct for variations in the integrated circuit due to noise, as well as systemic offsets that affect calibration values, ensuring that the binary code and the input calibration value at optimal levels.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like element elements throughout and wherein.

BEST MODE FOR CARRYING OUT THE INVENTION

The disclosed embodiment is directed to an integrated circuit, for example a microprocessor or a device that interfaces with the microprocessor via a high-speed link such as a HyperTransport™ link, having a voltage mode transmit driver, an input termination module, and a calibration module. The voltage mode transmit driver is configured for setting an output impedance for a transmission line. The input termination module is configured for setting an input impedance for a transmission line, and the calibration module is configured for providing control signals to the voltage mode transmit driver and the input termination network.

Figure 1:
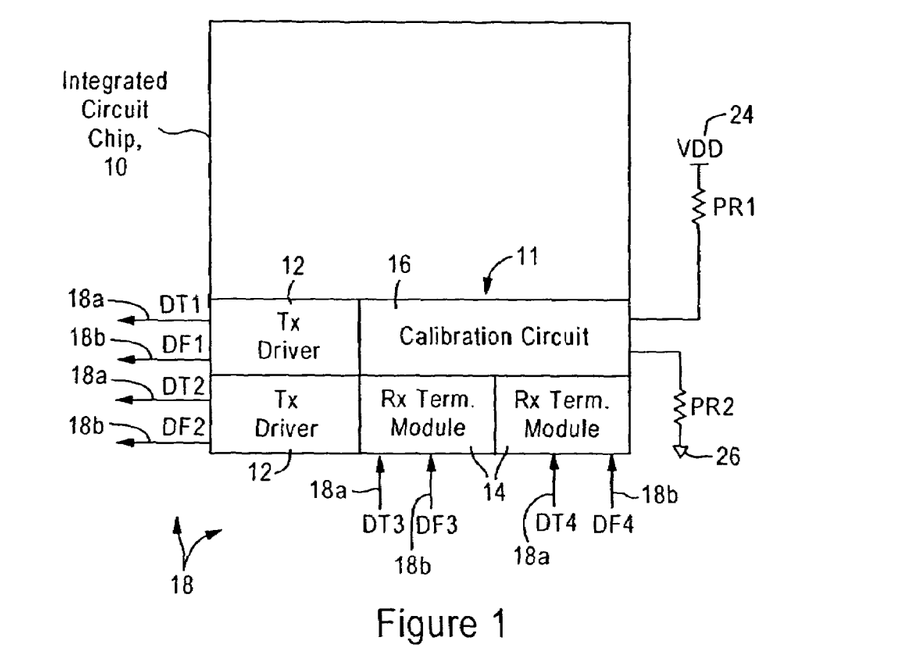
FIG. 1 is a block diagram illustrating an integrated circuit chip having a voltage mode transmit driver connected to an output signal path, an input termination module connected to an input signal path, and a calibration circuit for dynamically adjusting the voltage mode transmit path and the input termination module path to match the impedances of the connected signal paths, according to an embodiment of the present invention.

FIG. 1 is a diagram illustrating an integrated circuit chip 10 having a plurality of voltage mode transmit drivers 12, input termination modules 14, and at least one calibration circuit 16, according to an embodiment of the present invention. The voltage mode transmit drivers 12 are configured for outputting differential signals "data true" (DT) and "data false" (DF) (e.g., DT1 and DF1; DT2 and DF2) onto differential signal transmission lines 18a and 18b, respectively. The input termination modules 14 are configured for receiving the differential signals DT and DF (e.g., DT3 and DF3; DT4 and DF4) from differential signal lines 18a and 18b, respectively. As recognized in the art, multiple data lines will utilize multiple transmission lines 18 based on the number of bits to be sent or received; for example, a 64-bit bus would utilize 64 pairs of differential signal lines 18*a* and 18*b*. Hence, the calibration circuit 16 is configured for supplying the same output impedance correction factor 20 to the drivers 12 within a contiguous area 11 of the integrated circuit chip 10, and the same input impedance calibration value 22 to the input termination modules 14 within the contiguous area 11.

As described below, the calibration circuit 16 is coupled to external precision resistors PR1 and PR2, each having a precise resistance value with a tolerance of about one percent (1%). The precision resistor PR1 has a first terminal end coupled to the calibration circuit 16, and a second terminal end coupled to a supply voltage (VDD) 24. The precision resistor PR2 has a first terminal end coupled to the calibration circuit 16, and a second terminal end coupled to a base voltage (e.g., ground) 26.

Figure 2:
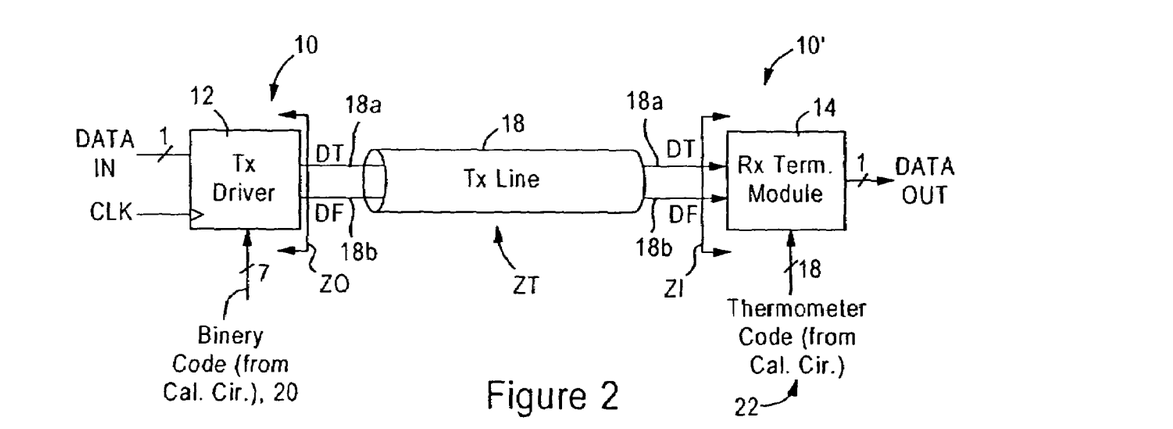
FIG. 2 is a diagram illustrating connection of a voltage mode transmit driver of FIG. 1 of one integrated circuit chip and an input termination module of FIG. 1 for a second integrated circuit chip to a differential pair transmission line.

FIG. 2 is a diagram illustrating a transmission line 18 (e.g., a pair of PC board traces) used to transfer data (DATA IN) in the form of differential signals (DT, DF) from a transmit driver 12 on one integrated circuit chip 10 to an input termination module ("Rx Term. Module") 14 on another integrated circuit chip 10'. As well known, the transmit driver 12 has a corresponding output impedance (ZO), the transmission line has a corresponding transmission line impedance (ZT), and the input termination module 14 has a corresponding input impedance (ZI). As described above, variations in manufacturing processes, temperature, and voltage can change resistance values in identical integrated circuits 10 and 10'; hence, coupling the devices 10 and 10' as shown in FIG. 2 without any impedance matching can cause impedance variations by as much as fifty percent (50%).

As described below, the disclosed embodiment enables the integrated circuit 10 to provide precise control of its output impedance ZO of the transmit driver 12, and the integrated circuit 10' to provide precise control of the input impedance ZI, to a tolerance of within five percent (5%). Moreover, the output impedance ZO and input impedance ZI can be controlled with minimal power utilization and minimal capacitance.

As illustrated in FIG. 2, the voltage mode transmit driver 12 is configured for outputting the differential signals DT and DF based on a data input (DATA IN), a clock signal (CLK), and a binary code 20 from the calibration circuit 16, described below. The input termination module 14 is configured for receiving the differential signals DT and DF having passed through the transmission line 18, and adjusting its input impedance ZI based on an input impedance calibration value 22 received from the calibration circuit 16. As described below, the input impedance calibration value 22 is implemented as a "thermometer code", where the input impedance calibration 22 is composed of monotonically increasing bits, where a value is incremented by transitioning only one bit from a zero to a one value; hence, the thermometer code "0000" is incremented to values "1, 2, 3, 4" by incrementing a contiguous bit in the sequence "0001", "0011", "0111", and "1111", respectively.

Hence, a thermometer-decoded value 22 is defined as having a first contiguous group of bits having a true value, wherein any bits within the input impedance calibration value 22 having a false value are contiguous and separated by the first contiguous group by a single transition ("01"). As described below, use of thermometer decoding prevents rollover of a most significant bit, since every bit is considered a "least significant bit", thereby preventing any discontinuity in the input impedance ZI when the control code is changed.

Figure 3:
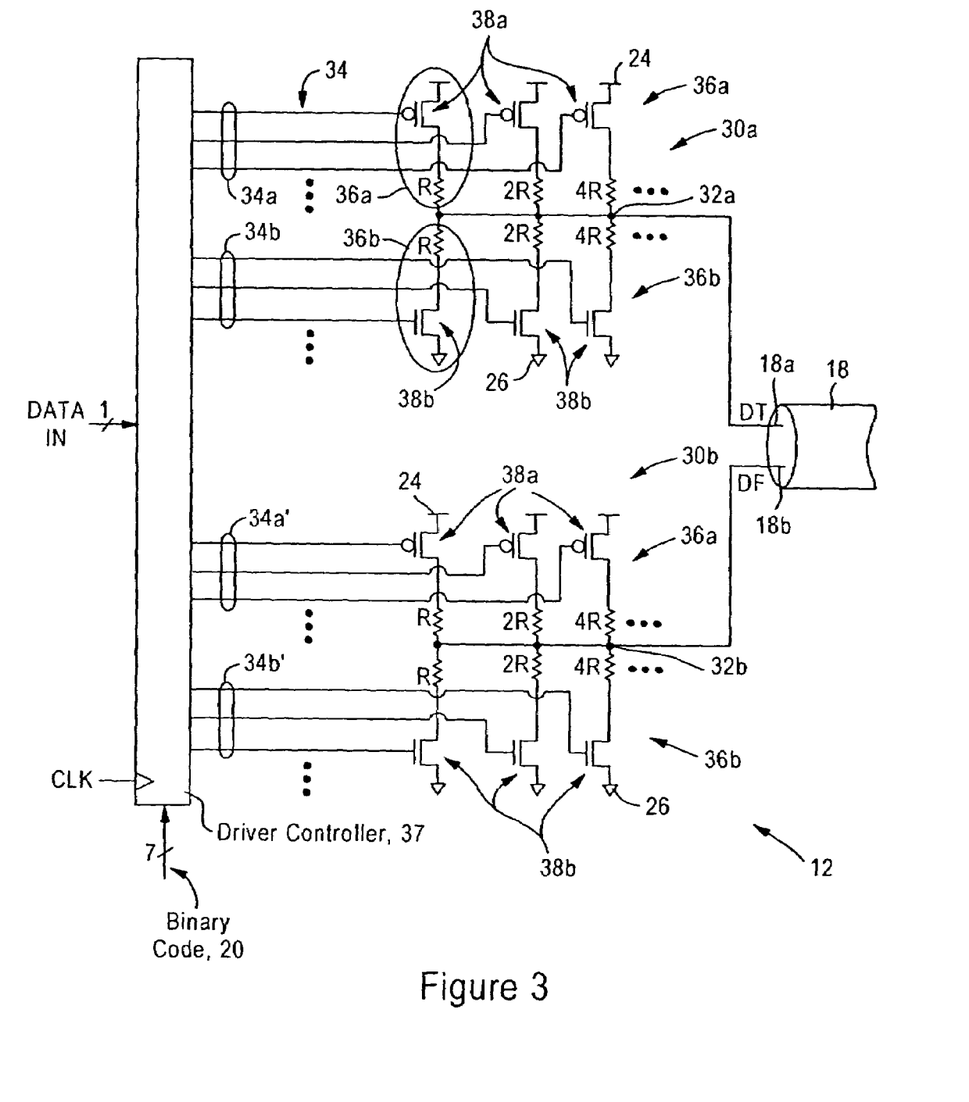
FIG. 3 is a diagram illustrating the voltage mode transmit driver of FIG. 1, according to an embodiment of the present invention.

FIG. 3 is a diagram illustrating the voltage mode transmit driver 12, according to an embodiment of the present invention. The voltage mode transmit driver includes a first resistor network circuit 30*a* and a second resistor network circuit 30*b*. The resistor network circuits 30*a* and 30*b* are configured for outputting the respective differential signals DT and DF via signal nodes 32*a* and 32*b* onto the differential signal transmission lines 18*a* and 18*b*, respectively. As described above, the transmission lines 18*a* and 18*b* have a transmission line impedance ZT.

The voltage mode transmit driver 12 also includes a driver controller 37 configured for outputting gate signals 34 in response to a data input (DATA IN), a clock signal, and the binary code 20 generated by the calibration circuit 16. In particular, each of the resistor network circuits 30*a* and 30*b* are configured for receiving gate signals 34 that control the voltage value of the differential signals DT and DF, as well as the output impedance ZO.

As shown in FIG. 3, each resistor network circuit (30*a* and 30*b*) includes pull-up circuits 36*a* and pull-down circuits 36*b*. Each pull-up circuit 36*a* and pull-down circuit 36*b* of the resistor network 30*a* is configured for selectively changing the voltage DT and output impedance on the corresponding signal node 32*a* based on its corresponding pull-up gate signal 34*a* and pull-down gate signal 34*b*, respectively. Similarly, each pull-up circuit 36*a* and pull-down circuit 36*b* of the resistor network 30*b* is configured for selectively changing the voltage DF and output impedance on the corresponding signal node 32*b* based on its corresponding pull-up gate signal 34*a*' and pull-down gate signal 34*b*', respectively.

As illustrated in FIG. 3, each pull-up circuit 36*a* includes a P-FET transistor 38*a*, and each pull-down circuit 38*b* includes an N-FET transistor. Hence, each P-FET transistor 38*a* allows current to pass through a corresponding connected resistor until the corresponding pull-up gate signal 34 is asserted, at which point the P-FET transistor 38*a* disables current from passing through the corresponding resistor. Conversely, each N-FET transistor 38*b* does not allow current to pass through a corresponding connected resistor until the corresponding pull-up gate signal 34 is asserted.

As apparent from the foregoing, since the signals DT and DF are logical complements of each other, the pull-up gate signals 34*a* are logical complements of the respective pull-up gate signals 34*a*', and the pull-down gate signals 34*b* are logical complements of the respective pull-down gate signals 34*b*'. Hence, the driver controller 37 can invert the differential signals DT and DF, in response to a change in the DATA IN signal and synchronous with the clock signal CLK, merely by inverting all of the gate signals 34 simultaneously.

As illustrated in FIG. 3, the pull-up circuits 36*a* and the pull-down circuits 36*b* include resistors having respective binary weighted resistance values relative to each other (R, 2R, 4R, etc.). In other words, for each successive pull-up circuit 36*a* or pull-down circuit 36*b*, the corresponding pull-up/pull-down resistance has twice the resistance value as the resistance of the previous pull-up circuit 36*a* or pull-down circuit 36*b*. An exemplary resistance value is R=62.5 ohms.

The use of binary weighted resistance values enables the driver controller 37 to selectively connect the pull-up circuits 38*a* and/or pull-down circuits 38*b* as needed, based on the respective pull-up gate signals 34*a*, 34*a*' and/or pull-down gate signals 34*b*, 34*b*', in order to provide additional resistors in parallel to form a resistor divider network in order to change the output impedance ZO. Hence, the output impedance ZO between the supply voltage node 24 and the signal node 32a or 34b is based on the parallel combination of the resistance provided by the activated pull-up circuits 38a. Similarly, the output impedance ZO between the signal node 32a or 32b and the base voltage (e.g., ground) 26 is based on the parallel combination of the resistances provided by the activated pull-down circuits 36b.

Figure 4:
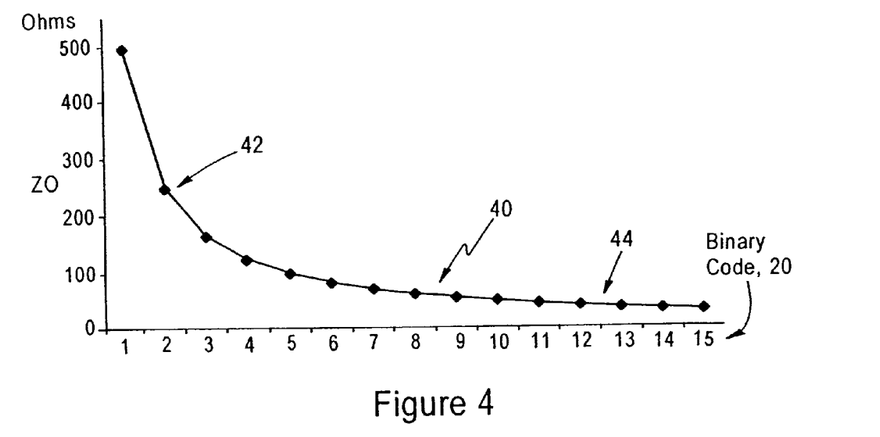
FIG. 4 is a diagram illustrating an inverse hyperbolic impedance mapping using a binary coding of the voltage mode transmit driver of FIG. 3, according to an embodiment of the present invention.

FIG. 4 is a diagram illustrating the change in output impedance ZO based on changing the binary code value 20 in a 4-bit weighting scheme, wherein the binary code range is 1–15. Hence, in a 4-bit waiting scheme, the most significant bit of the binary code 20 is used to drive the lowest resistance value (R), and the least significant bit drives the highest resistance value (e.g., 8R). As apparent from FIG. 4, the output impedance follows an inverse hyperbolic function 40 for adjusting the output impedance ZO across a wide range (e.g., 45 to 550 Ohms). Note, however, changes in relatively small binary values (e.g., at region 42), where relatively few resistors are connected, results in a relatively large change in resistance value step size; conversely, if a large number of resistors are connected (e.g., at region 44), the corresponding step size is significantly reduced. Hence, the number of needed bits for the binary code is a function of the percentage a variation of each resistive element based on the process technology used to manufacture the integrated circuit, and the calibration accuracy that is needed.

As described above, the driver controller 37 is configured for controlling each of the pull-up gate signals 34a, 34a' and the pull-down gate signals 34b, 34b' based on the data input signal (DATA IN), the clock signal (CLK), and the binary code 20. A change in the binary code 20 may result in a substantial change in the output impedance ZO due to a large step size; in addition, the transition of a large significant bit (e.g., "0011111" to "0100000") may create a transient rollover in the connected resistors, resulting in a transient jump in the output impedance. Hence, the binary code is changed synchronously with the clock to insure that voltage spikes are not induced onto the data signals DT and DF during valid phases of the data signals.

Figure 5:
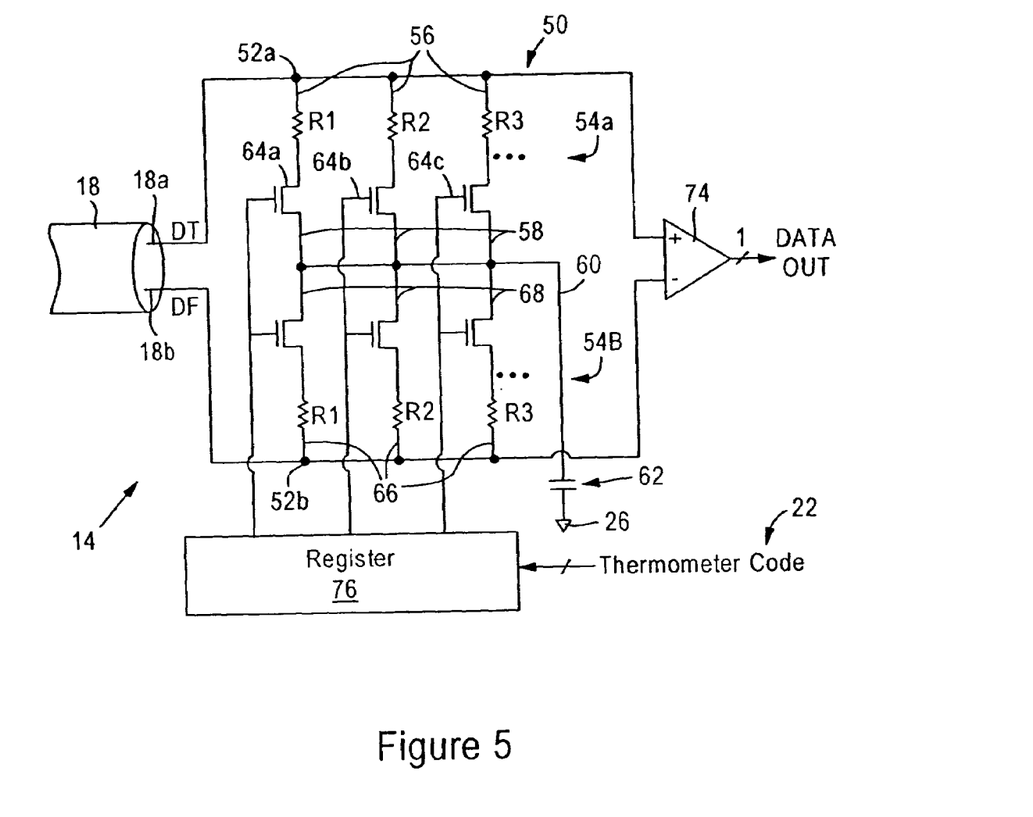
FIG. 5 is a diagram illustrating the input termination module of FIG. 1, according to an embodiment of the present invention.

FIG. 5 is a diagram illustrating the input termination module 14, according to an embodiment of the present invention. The input termination module 14 includes a resistor network circuit 50 configured for receiving differential signals DT and DF, via respective signal nodes 52a and 52b, from the differential signal transmission lines 18a and 18b.

The resistor network circuit 50 includes pull-up circuits 54a and pull-down circuits 54b. Each pull-up circuit 54a has a first terminal end 56 coupled a signal node 52a and a second terminal end 58 coupled to a common node 60 that is coupled via a capacitor 62 to ground 26. The pull-up circuits 54a are configured for selectively changing the input impedance ZI on the third signal node based on respective gate signals 64 (e.g., 64a, 64b, 64c, etc.).

The pull-down circuits 54b each have a terminal end 66 coupled to the signal node 52b, another terminal end 68 coupled to the common node 60, and sharing the gate signals 64a, 64b, and 64c the pull-up circuits 54a. The pull-down circuits 54b are configured for selectively changing an impedance on the signal node 52b based on the respective gate signals 64a, 64b, 64c. In addition, the pull-up and pull-down circuits 54a and 54b include resistors R1, R2, R3, etc. that have inverse hyperbolically weighted resistance values relative to each other. The thermometer-coded input impedance calibration value 22 is stored in a register 76, and the respective bits are supplied as the respective gate signals 64a, 64b, 64c, etc.

Figure 6:
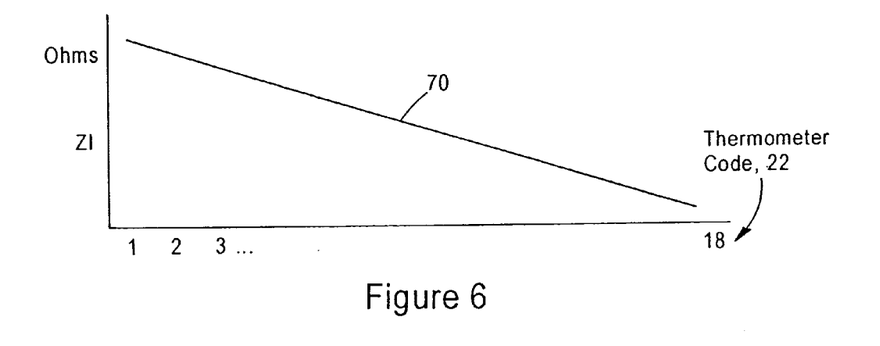
FIG. 6 is a diagram illustrating a linear impedance mapping using a thermometer decoding of the input termination module of FIG. 5.
Figure 7:
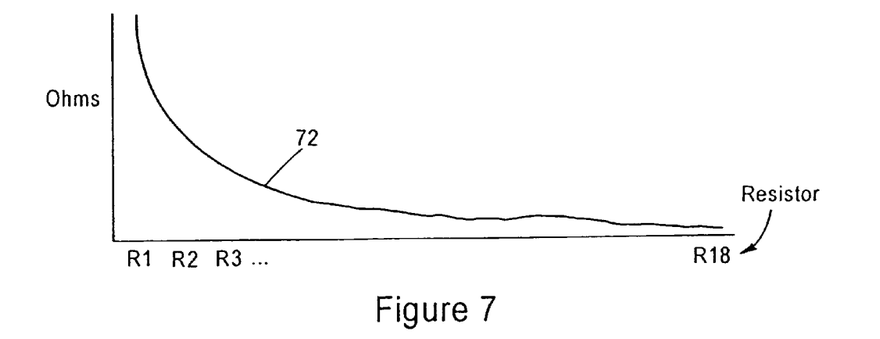
FIG. 7 is a diagram illustrating the inverse hyperbolic weighting of the resistors of the input termination module of FIG. 5.

As illustrated in FIG. 6, a linear change 70 in input impedance is obtained by utilizing resistors having inverse hyperbolically weighted resistance values according to the inverse hyperbolic function 62 of FIG. 7. In particular, the use of thermometer decoding to successively add a corresponding group of a pull-up circuit and a pull-down circuit having a corresponding resistance value (e.g., add R2 in parallel with R1) based on asserting the corresponding gate signal (e.g., 64b), ensures that any change in the input impedance ZI is linear and toward the desired input impedance. In addition, any change in the signal values of DT and DF should not change the common mode voltage at node 60, unless there the changes between DT and DF are not symmetric; in this case, the capacitor 62 removes any common mode noise generated due to the asymmetric transitions in the values of DT and DF. The reduction in common mode noise improves the common mode range for the differential amplifier 74 in detecting the digital value (DATA OUT).

Figure 9:
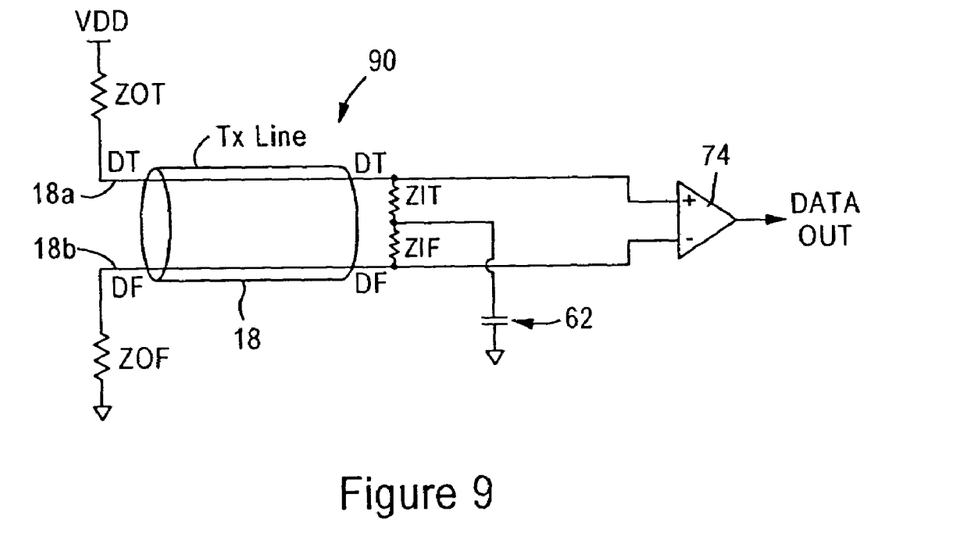
FIG. 9 is a diagram illustrating an equivalent circuit of the connected circuits of FIG. 2.

Hence, the selection of the output impedance ZO by the transmit driver 12 and the input impedance ZI by the input termination module 22 results in the equivalent circuit 90 of FIG. 9. As illustrated in FIG. 9, the transmit driver 12 provides a single-ended output impedance ZOT and ZOF on differential lines 18a and 18b, respectively, and the receive terminator module 14 provides a single-ended input impedance ZIT and ZIF on differential lines 18a and 18b, respectively. Capacitor 62 decouples the common mode node between the equivalent impedances ZIT and ZIF.

Figure 8:
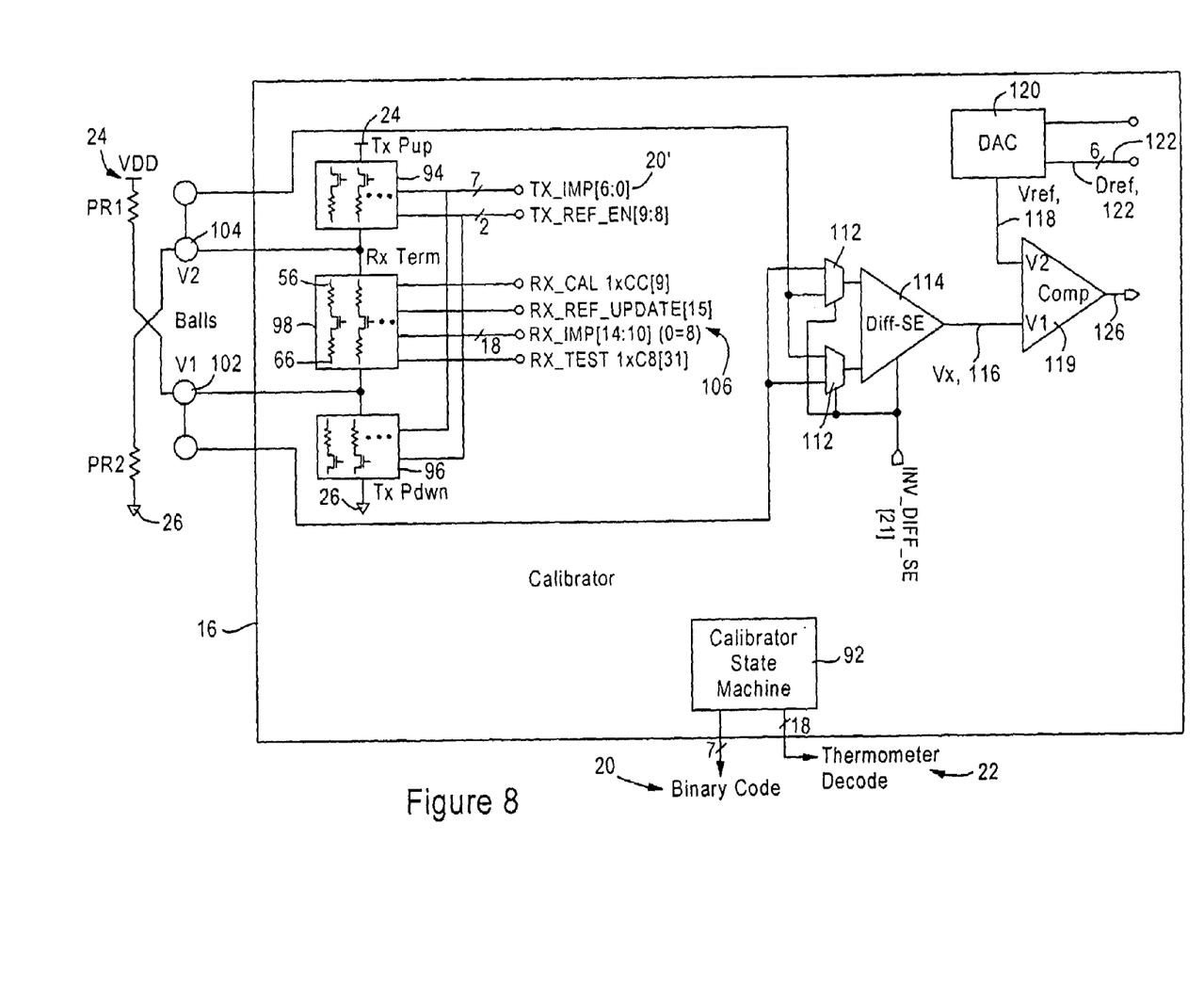
FIG. 8 is a diagram illustrating the calibration circuit of FIG. 1, according to an embodiment of the present invention.

FIG. 8 is a diagram illustrating the calibration circuit 16 of FIG. 1, according to an embodiment of the present invention. The calibration circuit 16 is configured for periodically updating the binary code 20 and the input impedance calibration value 22 relative to the external precision resistors PR1 and PR2. The calibration circuit 16 includes a calibrator state machine 92 configured for executing the calibration procedures described herein, supplying the internal test signals, and outputting the binary code 20 and the input impedance calibration value 22.

The calibration circuit 16 includes a replica 94 of the pull-up circuits 36a a replica 96 of the pull-down circuits 36b of the voltage mode transmit driver 12, and a replica 98 of the resistor network circuit 50 of the input termination module 14. The calibrator state machine 92 is configured for determining the optimum binary code 20 based on comparing voltages V1 and V2 at nodes 102 and 104, respectively, the nodes 102 and 104 implemented as the physical interface between the integrated circuit and the PC board, for example a "solder ball".

The calibrator state machine 92 is configured for determining the binary code 20, at prescribed intervals for calibration of the binary weighted resistance values, based on comparing the voltage V1 to a the voltage V2 across a range of the binary code (1 increasing up to maximum value, or maximum value decremented to 1). In particular, the binary code 20 is determined by first disabling the receiver terminal replica 98 by setting the input impedance calibration value 106 to zero, resulting in an open circuit.

Following disabling of the receiver terminal replica 98, a first potential divider is formed by the supply voltage 24 supplied to the precision resistor PR1, which is in series with the pull-down circuit replica 96 (via the connecting node 102), the pull-down circuit replica 96 connected to ground 26. Hence, the voltage V1 at node 102 is based on the potential divider between the precision resistor PR1 and the pull-down circuit replica 96.

A second potential divider is formed by the supply voltage 24 supplied to the pull-up circuit replica 94, which is in series with the precision resistor PR2 (via the connecting node 104), the precision resistor PR2 connected to ground 26. Hence, the voltage V2 at node 104 is based on the potential divider between the precision resistor PR1 and the pull-down circuit replica 96. The external precision resistors PR1 and PR2 each have a precision resistance representing an ideal transmission line impedance.

The voltages V1 and V2 are supplied to multiplexers 112, which supply the voltages V1 and V2 to a single-ended differential amplifier 114. The multiplexers ensure that the proper polarity is supplied to the amplifier 114, depending on whether the resistance values in the replicas 94 and 96, or 98 (as described below) are being increased or decreased over the procedure. The amplifier 114 supplies the single-ended voltage (Vx) 116, representing the difference between V1 and V2, to the comparator 119.

The comparator 119 compares the single-ended voltage (Vx) 116 to a prescribed voltage (Vref) 118 supplied by a DAC 120. The DAC 120 generates the prescribed voltage (Vref) 118 from a prescribed reference value (Dref) 122 supplied by the calibrator state machine.

Calibration of the transmit driver 12 by selecting a binary code will now be described. Following the disabling of the receiver terminal replica 98 by setting the calibration values 106 to zero, resulting essentially in an open circuit within the replica 98, the calibrator state machine 92 sets the test binary code 20' to one end of the range (e.g., minimum), and continues incrementing (or decrementing) the test binary code 20' until detecting a transition in the comparator output 126, which indicates that the replicas 94 and 96 are at the resistance value matching the precision resistors PR1 and PR2. The calibrator state machine 92 records the test binary code 20' value that caused the transition in the comparator output 126, and repeats the procedure from the other end of the range (e.g., maximum), and decrements (or increments) the test binary code 20' until another transition is detected in the comparator output 126. The calibration state machine 92 stores the second test binary code 20' having caused the transition in the comparator output 126, and averages the two binary codes 20' to remove any potential hysteresis.

The above procedure is repeated for a statistically significant number of iterations (e.g., 125 times) to filter any noise in the comparison operation, and the mean value of the averaged binary codes is output as the final binary code 20.

Determining the thermometer-decoded input impedance calibration value 22 is performed based on first disabling the pull-up circuit replica 94 and the pull-down circuit replica 96, creating a potential divider based on the supply voltage 24 being supplied to precision resistor PR1 in series (via node 102) with the terminal end 66 of the receiver resistor network replica 98. The terminal end 56 of the receiver resistor network replica 98 is coupled to the precision resistor PR2 via node 104, and the precision resistor PR2 is further coupled to ground.

Hence, the voltages V1 and V2 represent the voltages at the terminal ends 66 and 56 of the receiver resistor network replica 98. Similar to the calibration of the replicas 94 and 96, the calibrator state machine begins at a minimum value (or maximum) for the calibration test value 106 (equivalent to 22), and increases (or decreases) the thermometer-decoded value 106 until detecting a transition in the comparator output 126, which indicates that the replica 98 is set at the resistance value matching the precision resistors PR1 and PR2. The calibrator state machine 92 records the calibration test value 106 that caused the transition in the comparator output 126, and repeats the procedure from the other end of the range (e.g., maximum), and decrements (or increments) the calibration test value 106 until another transition is detected in the comparator output 126. The calibration state machine 92 stores the second calibration test value 106 having caused the transition in the comparator output 126, and averages the two calibration test values 106 to remove any potential hysteresis. The procedure is repeated for a statistically significant number of iterations (e.g., 125 times), and the mean value of the calibration test value 106 is output as the input impedance value.

Note that the disclosed calibrator circuit 16 may be modified by inserting a multiplexer (not shown) in between the differential amplifier 114 and the comparator 119, enabling the signal under test (Vx) 116 to be selected from a plurality of sources. Hence, the DAC 120 and the comparator 119 may be employed to calibrate numerous voltage sources, including identifying a unknown voltage signal Vx, by sweeping the reference voltage Vref 118 relative to the unknown DC voltage signal Vx 116.

Figure 10:
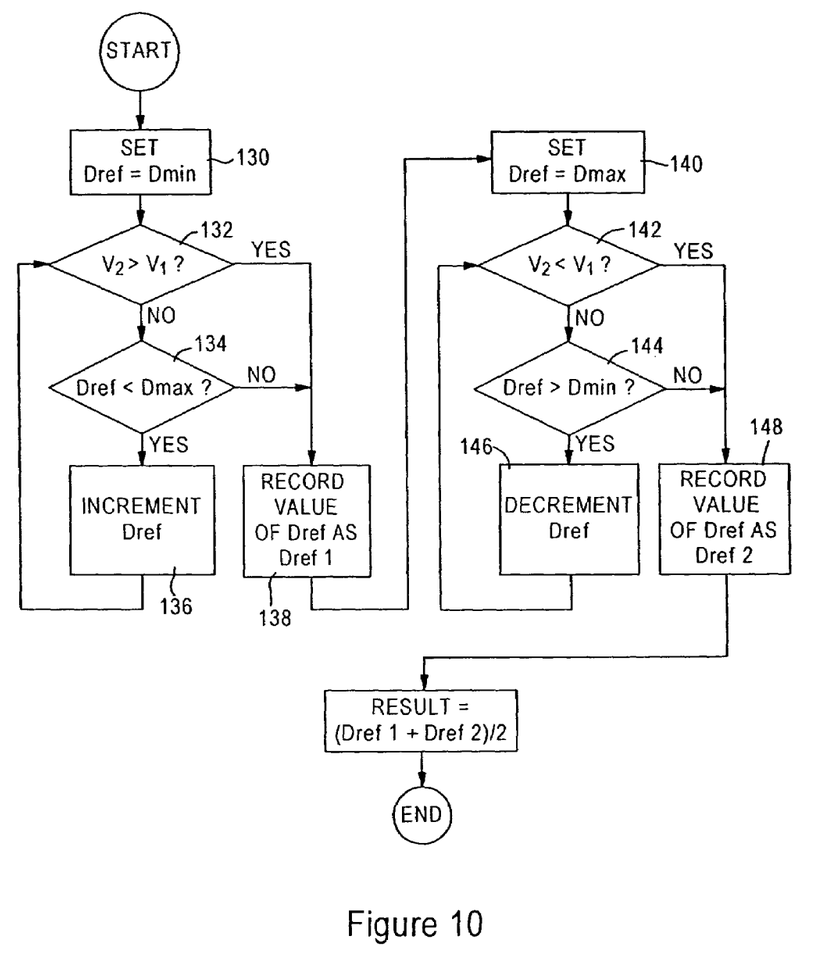
FIG. 10 is a diagram illustrating a method of determining a voltage value of a supplied DC voltage signal, using the calibration circuit of FIG. 8, according to an embodiment of the present invention.

FIG. 10 is a diagram illustrating a method for accurate measurement of an unknown voltage Vx, particularly beneficial in an electrically noisy environment. In contrast to the prior calibration of the resistor circuits by sweeping the binary codes 20' or 106 relative to a constant reference value Dref 122, in this case the reference value Dref 122 is swept, discretely and monotonically, across its range (Dmin to Dmax) relative to the constant unknown DC voltage signal Vx 116 output by a multiplexer.

The method begins in step 130, where the reference voltage value Dref 122 is set by the state machine 92 to a minimum value (Dref=Dmin) to initiate a minimum to maximum voltage sweep of the reference voltage value 122. If in step 132 the comparator 119 determines that the reference voltage Vref 118 output by the DAC 120 is not greater than the input voltage Vx 116, then the state machine 92 checks in step 134 whether the current reference voltage value Dref 122 is less than maximum Dmax; if the comparator 119 determines that the current reference voltage value Dref 122 is less than the maximum value Dmax, the reference voltage value Dref 122 is incremented in step 136 and the comparison operation is repeated in step 132.

If in step 132 the comparator 119 determines that the reference voltage Vref 118 output by the DAC 120 is greater than the input voltage Vx 116, of if in step 134 the comparator 119 determines that the current reference voltage value Dref 122 is not less than the maximum value Dmax, the state machine 92 records in step 138 the current reference voltage value Dref 122 as Dref1 (Dref1=Dref).

The measurement process of FIG. 10 next performs the measurement sweep from the opposite direction, namely sweeping the reference voltage value 122 from a maximum reference value (Dmax) to the minimum value (Dmin). The current reference voltage value Dref 122 is set by the state machine 92 in step 140 to the maximum (Dref=Dmax). If in step 142 the comparator 119 determines that the reference voltage Vref 118 output by the DAC 120 is not less than the input voltage Vx 116, then the state machine 92 checks in step 144 whether the current reference voltage value Dref 122 is greater than minimum Dmin; if the comparator 119 determines that the current reference voltage value Dref 122 is greater than the minimum value Dmin, the reference voltage value Dref 122 is decremented in step 146 and the comparison operation is repeated in step 142.

If in step 142 the comparator 119 determines that the input voltage Vx 116 is greater than the reference voltage Vref 118 output by the DAC 120, of if in step 144 the comparator 119 determines that the current reference voltage value Dref 122 is not greater than the minimum value Dmin, the state machine 92 records in step 148 the current reference voltage value Dref 122 as Dref2 (Dref2=Dref). The state machine 92 then averages in step 150 the values of Dref1 and Dref2 in order to determine the resulting value of the unknown signal Vx 116.

According to the disclosed embodiment, input impedance and output impedances are dynamically monitored and adjusted to ensure optimal matching with a transmission line. In addition, the disclosed embodiment provides precise impedance matching with minimal power supply requirements and minimal capacitance.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. An integrated circuit comprising:
    a voltage mode transmit driver comprising:
    (1) first and second resistor network circuits configured for outputting respective first and second differential signals via respective first and second signal nodes onto first and second differential signal transmission lines having a transmission line impedance, the first and second resistor network circuits each comprising:
    (1)(a) pull-up circuits configured for selectively changing an impedance on the corresponding signal node of the corresponding resistor network circuit based on respective pull-up gate signals, the pull-up circuits having respective binary weighted resistance values relative to each other,
    (1)(b) pull-down circuits configured for selectively changing an impedance on the corresponding signal node of the corresponding resistor network circuit based on respective pull-down gate signals, the pull-down circuits having the respective binary weighted resistance values relative to each other, and
    (2) a driver controller configured for controlling each of the pull-up gate signals and the pull-down gate signals based on a data input signal, a clock signal, and a binary code representing an output impedance correction factor, the driver controller configured for causing the first and second resistor network circuits to match an output impedance of the first and second nodes to the transmission line impedance based on the binary code; and
    a calibration circuit having a replica of the pull-up circuits and a replica of the pull-down circuits, the calibration circuit configured for determining the binary code, at prescribed intervals for calibration of the binary weighted resistance values, based on comparing a first voltage to a second voltage across a range of the binary code, the first and second voltages generated by respective first and second potential dividers formed between first and second external precision resistors and the replicas of the pull-up circuits and the pull-down circuits, respectively, the first and second external precision resistors each having a precision resistance representing an ideal transmission line impedance.

2. The integrated circuit of claim 1, further comprising an input termination module comprising a third resistor network circuit configured for receiving third and fourth differential signals, via respective third and fourth signal nodes, from respective third and fourth differential signal transmission lines having a second transmission line impedance, the third resistor network including:
    second pull-up circuits each having a first terminal end coupled to the third signal node and a second terminal end coupled to a common node capacitively coupled to ground, the second pull-up circuits configured for selectively changing an impedance on the third signal node based on respective gate signals,
    second pull-down circuits, each having a third terminal end coupled to the fourth signal node, a fourth terminal end coupled to a common node, and sharing the gate signal with a corresponding one of the second pull-up circuits, the second pull-down circuits configured for selectively changing an impedance on the fourth signal node based on the respective gate signals, the second pull-down circuits having the inverse hyperbolically weighted resistance values relative to each other;
    wherein the calibration circuit further includes a replica of the third resistor network circuit and is configured for generating an input impedance calibration value based on comparing the replica of the third resistor network circuit to the first and second external precision resistors;
    wherein the input impedance calibration value corresponds to the gate signals in a prescribed sequence.

3. The integrated circuit of claim 2, wherein the calibration circuit is configured for generating the input impedance calibration value based on comparing third and fourth voltages across a range of the input impedance calibration value, the third and fourth voltages generated based on a third potential divider formed by coupling the first terminal end and the third terminal end of the replica of the third resistor network circuit to the first and second external precision resistors, respectively.

4. The integrated circuit of claim 3, wherein the second pull-up circuits and the second pull-down circuits have respective inverse hyperbolically weighted resistance values relative to each other, the input impedance calibration value having a first contiguous group of bits having a true value, wherein any bits within the input impedance calibration value having a false value are contiguous and separated by the first contiguous group by a single transition.

5. The integrated circuit of claim 4, wherein each pull-up circuit of the voltage mode transmit driver includes a transistor configured for selectively disabling current from passing through the corresponding resistor in response to the corresponding pull-up gate signal, the corresponding resistor coupled to the corresponding signal node of the corresponding resistor network circuit.

6. The integrated circuit of claim 4, wherein the calibration circuit is configured for determining the input impedance calibration value based on successively changing a calibration test value supplied to the replica of the third resistor network as the respective gate signals, and identifying a transition between the third and fourth voltages relative to the change in the calibration test value.

7. The integrated circuit of claim 4, further comprising a plurality of the voltage mode transmit drivers and input termination modules disposed within a contiguous area of the integrated circuit, the voltage mode transmit drivers within the contiguous area each receiving the binary code from said calibration circuit, the input termination modules within the contiguous area each receiving the input impedance calibration value from said calibration circuit.

8. The integrated circuit of claim 2, wherein the driver controller is configured for outputting the pull-up gate signals and the pull-down gate signals of the first resistor network circuit as respective logical complements of the pull-up gate signals and the pull-down gate signals of the second resistor network circuit.

9. The integrated circuit of claim 1, wherein the calibration circuit is configured for determining the binary code based on successively changing a calibration test value supplied to each of the replicas of the pull-up circuits and pull-down circuits as each of the respective pull-up gate signals and pull-down gate signals, and identifying a transition between the first and second voltages relative to the change in the calibration test value.

10. The integrated circuit of claim 1, wherein each pull-up circuit of the voltage mode transmit driver includes a transistor configured for selectively disabling current from passing through the corresponding resistor in response to the corresponding pull-up gate signal, the corresponding resistor coupled to the corresponding signal node of the corresponding resistor network circuit.

11. A method in an integrated circuit, the method comprising:
  providing in the integrated circuit a voltage mode transmit driver, the voltage mode transmit driver comprising:
  (1) first and second resistor network circuits configured for outputting respective first and second differential signals via respective first and second signal nodes onto first and second differential signal transmission lines having a transmission line impedance, the first and second resistor network circuits each comprising:
  (1)(a) pull-up circuits configured for selectively changing an impedance on the corresponding signal node of the corresponding resistor network circuit based on respective pull-up gate signals, the pull-up circuits having respective binary weighted resistance values relative to each other,
  (1)(b) pull-down circuits configured for selectively changing an impedance on the corresponding signal node of the corresponding resistor network circuit based on respective pull-down gate signals, the pull-down circuits having the respective binary weighted resistance values relative to each other, and
  (2) a driver controller configured for controlling each of the pull-up gate signals and the pull-down gate signals based on a data input signal, a clock signal, and a binary code representing an output impedance correction factor;
  causing, by the driver controller, the first and second resistor network circuits to match an output impedance of the first and second nodes to the transmission line impedance based on the binary code; and
  determining the binary code at prescribed intervals for calibration of the binary weighted resistance values by a calibration circuit having a replica of the pull-up circuits and a replica of the pull-down circuits, the calibration circuit configured for determining the binary code based on comparing a first voltage to a second voltage across a range of the binary code, the first and second voltages generated by respective first and second potential dividers formed between first and second external precision resistors and the replicas of the pull-up circuits and the pull-down circuits, respectively, the first and second external precision resistors each having a precision resistance representing an ideal transmission line impedance.

12. The method of claim 11, further comprising providing an input termination module comprising a third resistor network circuit configured for receiving third and fourth differential signals, via respective third and fourth signal nodes, from respective third and fourth differential signal transmission lines having a second transmission line impedance, the third resistor network including:
  second pull-up circuits each having a first terminal end coupled to the third signal node and a second terminal end coupled to a common node capacitively coupled to ground, the second pull-up circuits configured for selectively changing an impedance on the third signal node based on respective gate signals,
  second pull-down circuits, each having a third terminal end coupled to the fourth signal node, a fourth terminal end coupled to a common node, and sharing the gate signal with a corresponding one of the second pull-up circuits, the second pull-down circuits configured for selectively changing an impedance on the fourth signal node based on the respective gate signals, the second pull-down circuits having the inverse hyperbolically weighted resistance values relative to each other;
  wherein the calibration circuit further includes a replica of the third resistor network circuit and is configured for generating an input impedance calibration value based on comparing the replica of the third resistor network circuit to the first and second external precision resistors;
  wherein the input impedance calibration value corresponds to the gate signals in a prescribed sequence.

13. The method of claim 12, wherein the input impedance calibration value is generated based on the calibration circuit comparing third and fourth voltages across a range of the input impedance calibration value, the third and fourth voltages generated based on a third potential divider formed by coupling the first terminal end and the third terminal end of the replica of the third resistor network circuit to the first and second external precision resistors, respectively.

14. The method of claim 13, wherein the second pull-up circuits and the second pull-down circuits have respective inverse hyperbolically weighted resistance values relative to each other, the input impedance calibration value having a first contiguous group of bits having a true value, wherein any bits within the input impedance calibration value having a false value are contiguous and separated by the first contiguous group by a single transition.

15. The method of claim 14, wherein each pull-up circuit of the voltage mode transmit driver includes a transistor configured for selectively disabling current from passing through the corresponding resistor in response to the corresponding pull-up gate signal, the corresponding resistor coupled to the corresponding signal node of the corresponding resistor network circuit.

16. The method of claim 14, wherein the calibration circuit is configured for determining the input impedance calibration value based on successively changing a calibration test value supplied to the replica of the third resistor network as the respective gate signals, and identifying a transition between the third and fourth voltages relative to the change in the calibration test value.

17. The method of claim 4, further comprising a plurality of the voltage mode transmit drivers and input termination modules disposed within a contiguous area of the integrated circuit, the voltage mode transmit drivers within the contiguous area each receiving the binary code from said calibration circuit, the input termination modules within the contiguous area each receiving the input impedance calibration value from said calibration circuit.

18. The method of claim 12, wherein the driver controller is configured for outputting the pull-up gate signals and the pull-down gate signals of the first resistor network circuit as respective logical complements of the pull-up gate signals and the pull-down gate signals of the second resistor network circuit.

19. The method of claim 11, wherein the calibration circuit is configured for determining the binary code based on successively changing a calibration test value supplied to each of the replicas of the pull-up circuits and pull-down circuits as each of the respective pull-up gate signals and pull-down gate signals, and identifying a transition between the first and second voltages relative to the change in the calibration test value.

20. The method of claim 11, wherein each pull-up circuit of the voltage mode transmit driver includes a transistor configured for selectively disabling current from passing through the corresponding resistor in response to the corresponding pull-up gate signal, the corresponding resistor coupled to the corresponding signal node of the corresponding resistor network circuit.

21. A method in an integrated circuit, the method comprising:

supplying a voltage signal to a first input of a comparator in the integrated circuit;

providing in the integrated circuit a digital to analog converter configured for outputting a reference signal to a second input of the comparator in response to a digital reference value;

determining a first voltage value based on setting the digital reference value to a minimum value, and successively incrementing the digital reference value until detecting a first transition in the comparator, the first voltage value corresponding to the digital reference value upon detection of the first transition;

determining a second voltage value based on setting the digital reference value to a maximum value, and successively decrementing the digital reference value until detecting a second transition in the comparator, the second voltage value corresponding to the digital reference value upon detection of the second transition; and determining the voltage value of the voltage signal based on averaging the first voltage value and the second voltage value.

* * * * *